(12) United States Patent
Wang et al.

(10) Patent No.: US 12,253,888 B2
(45) Date of Patent: Mar. 18, 2025

(54) ELECTRONIC DEVICE

(71) Applicant: Acer Incorporated, New Taipei (TW)

(72) Inventors: Wei-Chih Wang, New Taipei (TW);
Chen-Min Hsiu, New Taipei (TW);
Chien-Yu Lee, New Taipei (TW);
Szu-Wei Yang, New Taipei (TW);
Fang-Ying Huang, New Taipei (TW)

(73) Assignee: Acer Incorporated, New Taipei (TW)

( * ) Notice: Subject to any disclaimer, the term of this patent is extended or adjusted under 35 U.S.C. 154(b) by 186 days.

(21) Appl. No.: 18/313,381

(22) Filed: May 8, 2023

(65) Prior Publication Data
US 2024/0111337 A1 Apr. 4, 2024

(30) Foreign Application Priority Data

Oct. 4, 2022 (TW) .................................. 111137624

(51) Int. Cl.
*G06F 1/16* (2006.01)
*H01R 13/52* (2006.01)
*H05K 5/02* (2006.01)

(52) U.S. Cl.
CPC ....... *G06F 1/1656* (2013.01); *H01R 13/5227* (2013.01); *H05K 5/0247* (2013.01)

(58) Field of Classification Search
None
See application file for complete search history.

(56) References Cited

U.S. PATENT DOCUMENTS

| | | | | |
|---|---|---|---|---|
| 5,650,591 | A * | 7/1997 | Matsushita | B60R 16/0239 174/17 VA |
| 6,113,407 | A * | 9/2000 | Martin | H01R 4/60 439/205 |
| 9,231,334 | B2 * | 1/2016 | Hara | H01R 13/518 |
| 9,668,370 | B1 * | 5/2017 | Huang | H05K 5/0217 |
| 9,772,658 | B1 * | 9/2017 | Hsu | G06F 1/1656 |
| 11,095,067 | B2 * | 8/2021 | Chang | H01R 31/065 |
| 2013/0078846 | A1 * | 3/2013 | Sasaki | B60L 53/31 439/374 |
| 2015/0064948 | A1 * | 3/2015 | Hara | H01R 13/5227 439/205 |
| 2015/0162698 | A1 * | 6/2015 | Hara | H01R 13/5219 439/157 |
| 2016/0360630 | A1 * | 12/2016 | Oda | A45F 5/00 |
| 2017/0373479 | A1 * | 12/2017 | Matsumoto | H02G 3/088 |
| 2018/0287290 | A1 * | 10/2018 | Kifune | H01R 13/6594 |
| 2018/0375249 | A1 * | 12/2018 | Hara | H01R 13/5227 |

FOREIGN PATENT DOCUMENTS

| | | |
|---|---|---|
| CN | 202092408 | 12/2011 |
| CN | 208955300 | 6/2019 |
| TW | M348397 | 1/2009 |
| WO | 2022202462 | 9/2022 |

* cited by examiner

*Primary Examiner* — Xanthia C Relford
(74) *Attorney, Agent, or Firm* — JCIPRNET

(57) ABSTRACT

An electronic device including a body and a receptacle connector is provided. The body has a side wall surface, a receptacle slot located at the side wall surface, a waterproof protrusion protruding from the side wall surface, and two gutters located at the side wall surface, where the waterproof protrusion is located above the receptacle slot, and the two gutters are respectively located at two opposite sides of the receptacle slot. The receptacle connector is disposed in the receptacle slot.

12 Claims, 5 Drawing Sheets

US 12,253,888 B2

ELECTRONIC DEVICE

CROSS-REFERENCE TO RELATED APPLICATION

This application claims the priority benefit of Taiwan application serial no. 111137624, filed on Oct. 4, 2022. The entirety of the above-mentioned patent application is hereby incorporated by reference herein and made a part of this specification.

BACKGROUND

Technical Field

The disclosure relates to an electronic device; more particularly, the disclosure relates to an electronic device with a waterproof design.

Description of Related Art

A common notebook computer is composed of a display and a body capable of performing logic operations and having a data access ability, and the display is pivoted to the body and thus able to rotate and open or close relative to the body. Generally, a plurality of receptacle connectors are disposed at a side of the body for transmitting signals or power. When a user accidentally pours water (or other liquid) onto the body, the water (or other liquid) flowing through the side of the body is very much likely to flow into a receptacle slot or penetrate into the body through the receptacle slot, which leads to failure of or damages to the receptacle connectors located in the receptacle slot or electronic parts located within the body.

SUMMARY

The disclosure provides an electronic device with a favorable waterproof capability.

In an embodiment of the disclosure, an electronic device that includes a body and a receptacle connector is provided. The body has a side wall surface, a receptacle slot located at the side wall surface, a waterproof protrusion protruding from the side wall surface, and two gutters located at the side wall surface, where the waterproof protrusion is located above the receptacle slot, and the two gutters are respectively located at two opposite sides of the receptacle slot. The receptacle connector is disposed in the receptacle slot.

In an embodiment of the disclosure, another electronic device that includes a body and a receptacle connector is provided. The body has a side wall surface, a receptacle slot located at the side wall surface, a liquid dividing slot located above the receptacle slot, and two gutters respectively located at two opposite sides of the receptacle slot, and the two gutters are respectively connected to two opposite ends of the liquid dividing slot. The receptacle connector is disposed in the receptacle slot.

In view of the above, in the electronic device provided in one or more embodiments of the disclosure, the body has a waterproof structure around the receptacle slot. When the user accidentally pours water (or other liquid) onto the body, the waterproof structure is able to block the water (or other liquid) flowing through the side wall surface of the body from entering the receptacle slot and prevent failure of or damages to the receptacle connector located in the receptacle slot or electronic parts located inside the body.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
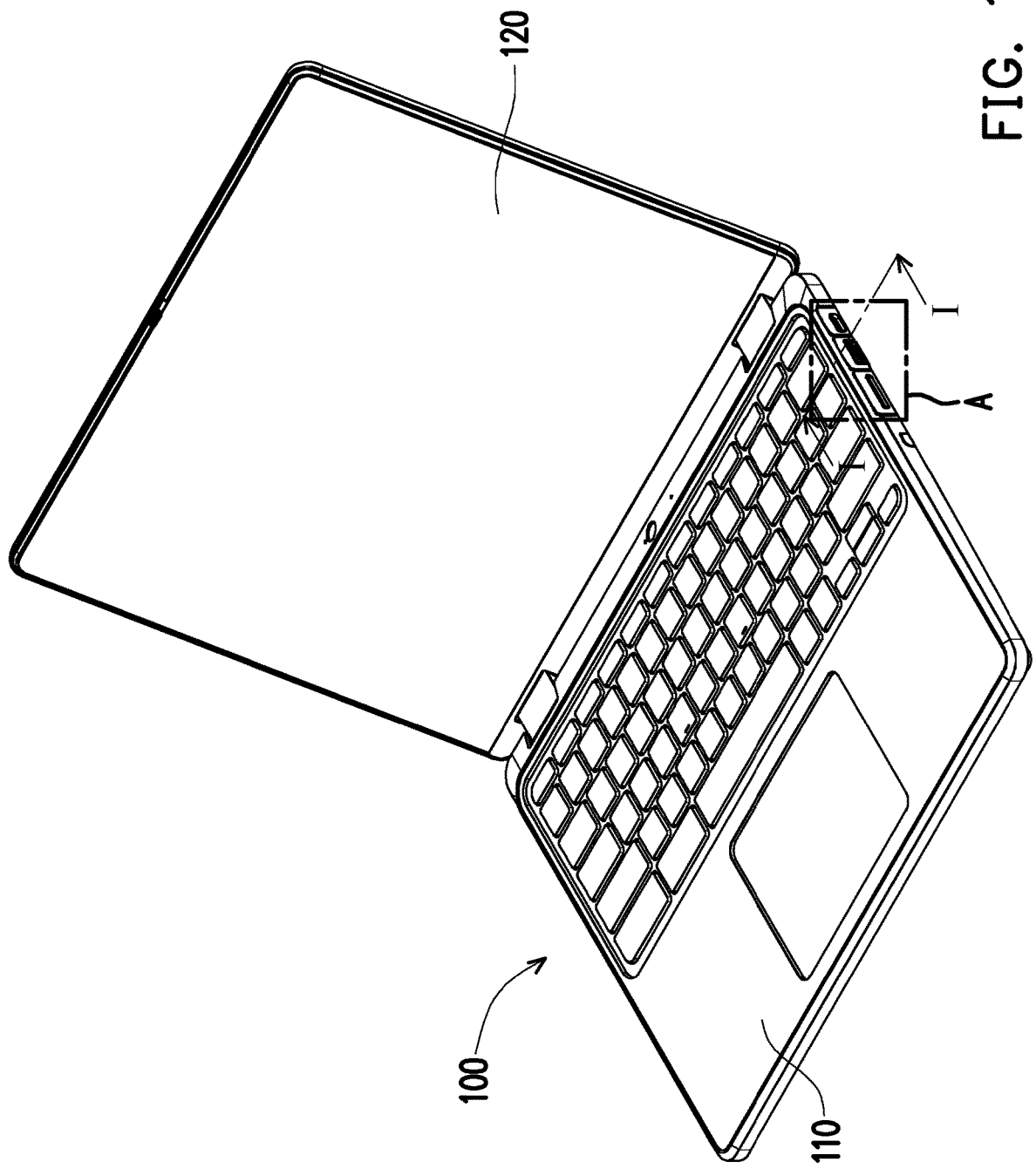
FIG. 1 is a schematic view of an electronic device according to an embodiment of the disclosure.

Reference is now made in detail to exemplary embodiments of the disclosure, and examples of the exemplary embodiments are described in the accompanying drawings. Whenever possible, the same reference numbers are used in the drawings and descriptions to indicate the same or similar parts.

Figure 2:
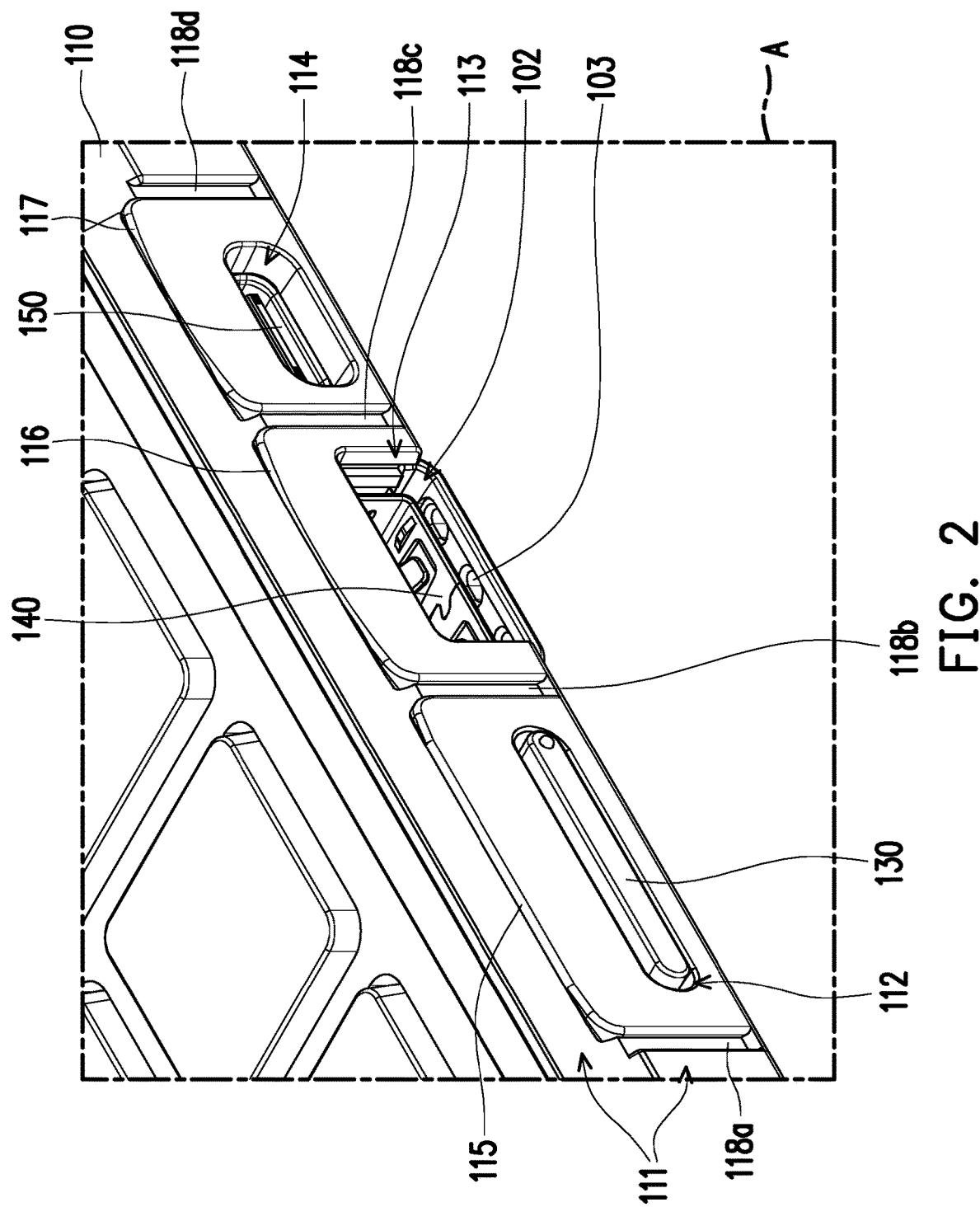
FIG. 2 is a schematic enlarged view of a zone A depicted in FIG. 1.

FIG. 1 is a schematic view of an electronic device according to an embodiment of the disclosure. FIG. 2 is a schematic enlarged view of a zone A depicted in FIG. 1. With reference to FIG. 1 and FIG. 2, in this embodiment, an electronic device 100 may be a notebook computer and includes a body 110, a display 120, a first receptacle connector 130, a second receptacle connector 140, and a third receptacle connector 150. The display 120 is pivoted to the body 110 to rotate and open or close relative to the body 110. In detail, the body 110 has a side wall surface 111, a plurality of receptacle slots located at the side wall surface 111, a plurality of waterproof protrusions protruding from the side wall surface 111, and a plurality of gutters 118a to 118d located at the side wall surface 111.

As shown in FIG. 2, the receptacle slots include a first receptacle slot 112, a second receptacle slot 113, and a third receptacle slot 114 arranged in order, and the waterproof protrusions include a first waterproof protrusion 115, a second waterproof protrusion 116, and a third waterproof protrusion 117 arranged in order. The first waterproof protrusion 115 is located above the first receptacle slot 112 and is configured to block water (or other liquid) flowing through the side wall surface 111 of the body 110 from entering the first receptacle slot 112, so as to prevent failure of or damages to the first receptacle connector 130 located in the first receptacle slot 112 or electronic parts located in the body 110.

Similarly, the second waterproof protrusion 116 is located above the second receptacle slot 113 and is configured to block the water (or other liquid) flowing through the side wall surface 111 of the body 110 from entering the second receptacle slot 113, so as to prevent failure of or damages to the second receptacle connector 140 located in the second receptacle slot 113 or the electronic parts located in the body 110. In addition, the third waterproof protrusion 117 is located above the third receptacle slot 114 and is configured to block the water (or other liquid) flowing through the side wall surface 111 of the body 110 from entering the third receptacle slot 114, so as to prevent failure of or damages to the third receptacle connector 150 located in the third receptacle slot 114 or the electronic parts located in the body 110.

As shown in FIG. 2, in this embodiment, the gutter 118a and the gutter 118b are respectively located at two opposite sides of the first receptacle slot 112 and respectively located at two opposite sides of the first waterproof protrusion 115. The gutter 118b and the gutter 118c are respectively located at two opposite sides of the second receptacle slot 113 and respectively located at two opposite sides of the second waterproof protrusion 116. In addition, the gutter 118c and the gutter 118d are respectively located at two opposite sides of the third receptacle slot 114 and respectively located at two opposite sides of the third waterproof protrusion 117. The adjacent first and second receptacle slots 112 and 113 are separated by the gutter 118b, and the adjacent second and third receptacle slots 113 and 114 are separated by the gutter 118c. That is, any two adjacent receptacle slots share one gutter.

To be specific, the water (or other liquid) blocked by the first waterproof protrusion 115 may respectively flow into the gutter 118a and the gutter 118b and may be guided to be discharged from a bottom of the body 110, so as to prevent failure of or damages to the first receptacle connector 130 located in the first receptacle slot 112 or the electronic parts located in the body 110. The water (or other liquid) blocked by the second waterproof protrusion 116 may respectively flow into the gutter 118b and the gutter 118c and may be guided to be discharged from the bottom of the body 110, so as to prevent failure of or damages to the second receptacle connector 140 located in the second receptacle slot 113 or the electronic parts located in the body 110. In addition, the water (or other liquid) blocked by the third waterproof protrusion 117 may respectively flow into the gutter 118c and the gutter 118d and may be guided to be discharged from the bottom of the body 110, so as to prevent failure of or damages to the third receptacle connector 150 located in the third receptacle slot 114 or the electronic parts located in the body 110.

As shown in FIG. 2, a corresponding waterproof structure and a corresponding liquid dividing structure are arranged around each receptacle slot. When a user accidentally pours water (or other liquid) onto the body 110, the waterproof structure is able to block the water (or other liquid) flowing through the side wall surface 111 of the body 110 from entering the receptacle slot, and the liquid dividing structure may guide the water (or other liquid) to the bottom of the body 110 to be discharged, so as to avoid failure of or damages to the receptacle connector located in the receptacle slot or the electronic parts located in the body 110.

Figure 3:
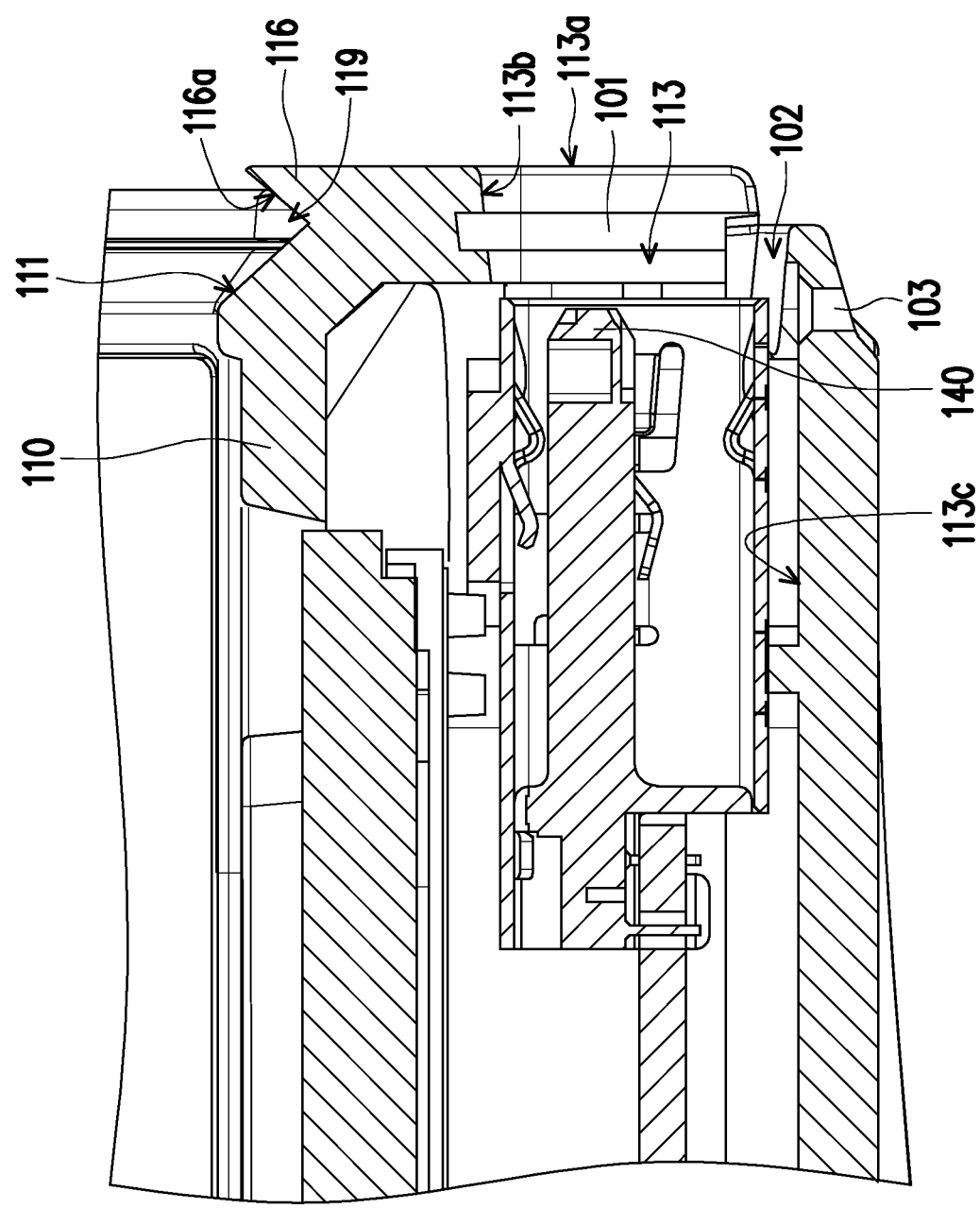
FIG. 3 is a schematic cross-sectional view taken along a sectional line I-I depicted in FIG. 1.

FIG. 3 is a schematic cross-sectional view taken along a sectional line I-I depicted in FIG. 1. As shown in FIG. 2 and FIG. 3, the second waterproof protrusion 116 has a waterproof surface 116a facing and connected to the side wall surface 111, and a liquid dividing slot 119 is defined between the waterproof surface 116a and the side wall surface 111. The gutter 118b and the gutter 118c are connected to two opposite ends of the liquid dividing slot 119, respectively, and the water (or other liquid) blocked by the second waterproof protrusion 116 is divided in the liquid dividing slot 119 and flows into the gutter 118b and the gutter 118c, respectively. Particularly, the waterproof surface 116a may be an inclined surface extending obliquely upward from the side wall surface 111, and the waterproof surface 116a and the side wall surface 111 may constitute a V-shaped slot, so as to achieve the effect of blocking and carrying water (or other liquid). Since the structural design of the first waterproof protrusion 115 is the same as that of the third waterproof protrusion 117 and that of the second waterproof protrusion 116, repetitive descriptions will be omitted hereinafter.

Figure 4:
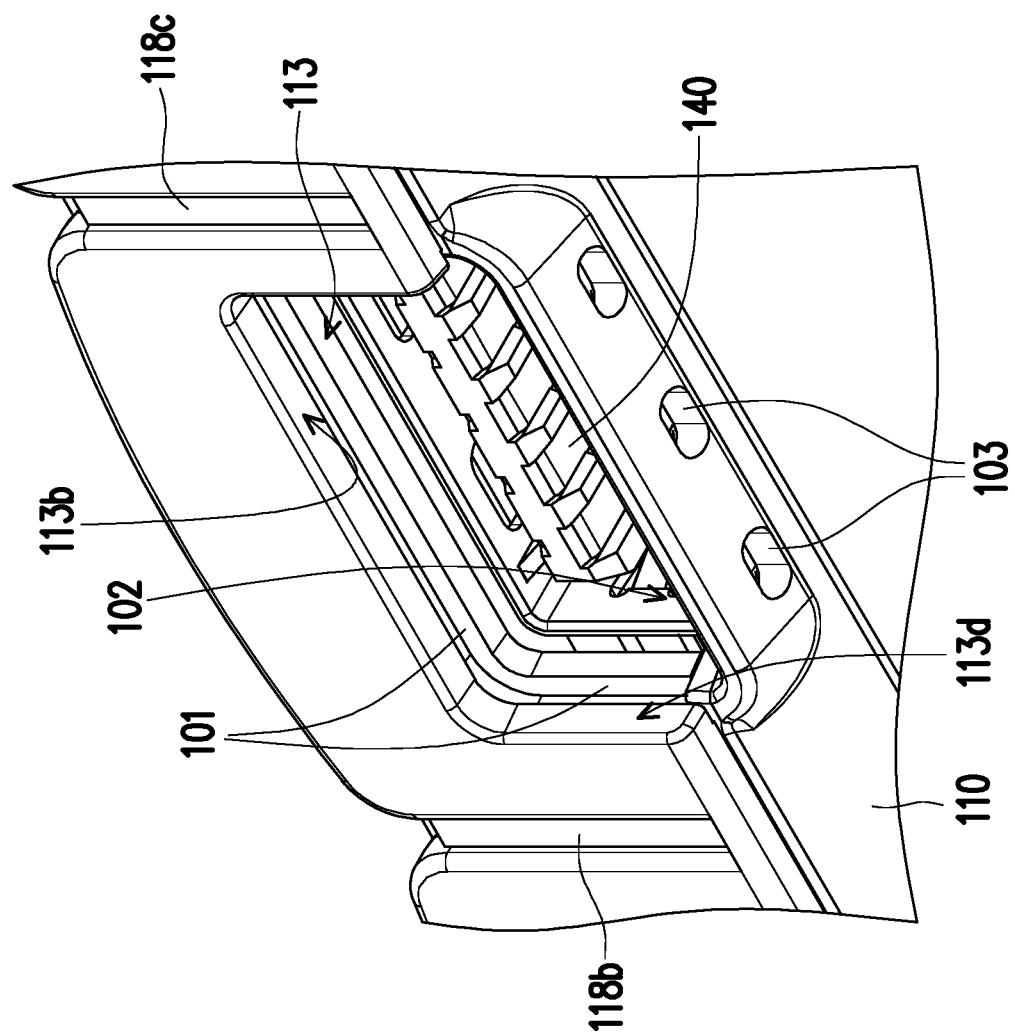
FIG. 4 and FIG. 5 are schematic enlarged views of the body depicted in FIG. 2 corresponding to a second receptacle slot at two different viewing angles.
Figure 5:
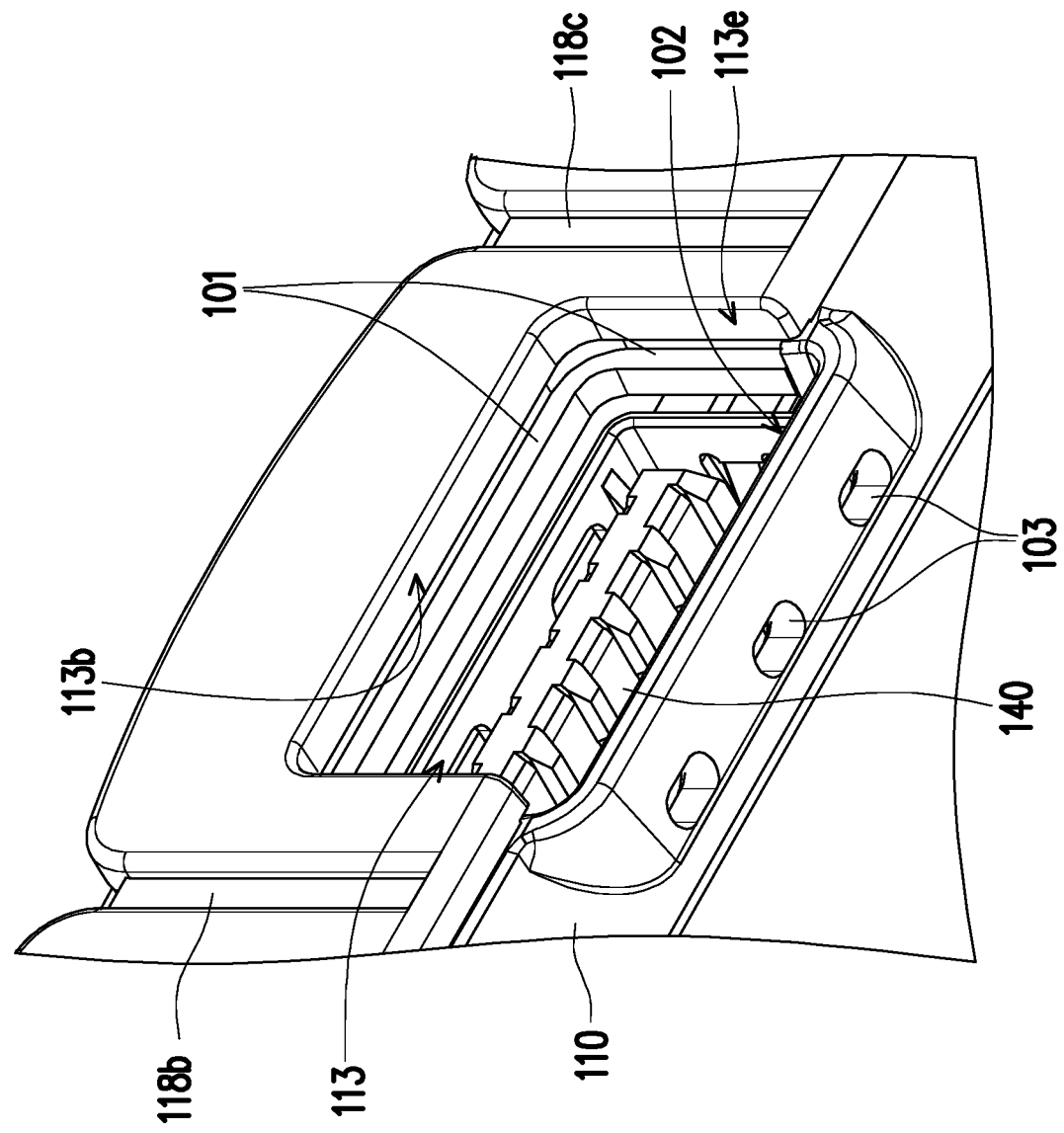

FIG. 4 and FIG. 5 are schematic enlarged views of the body depicted in FIG. 2 corresponding to the second receptacle slot at two different viewing angles. As shown in FIG. 2 to FIG. 5, the body 110 further has a waterproof slot 101 located in the second receptacle slot 113, and the waterproof slot 101 is located between the second receptacle connector 140 and an opening 113a of the second receptacle slot 113. When water (or other liquid) flows into the second receptacle slot 113, the waterproof slot 101 is able to prevent the water (or other liquid) from flowing further toward the second receptacle connector 140. In another aspect, the body 110 further has a drainage channel 102 located in the second receptacle slot 113, where the waterproof slot 101 is connected to the drainage channel 102, and the drainage channel 102 is connected to the opening 113a of the second receptacle slot 113. Accordingly, water (or other liquid) may flow into the drainage channel 102 through the waterproof slot 101, flow from the drainage channel 102 to the opening 113a, and flows out of the second receptacle slot 113 from the opening 113a.

As shown in FIG. 3 to FIG. 5, the second receptacle slot 113 has an inner top wall surface 113b, an inner bottom wall surface 113c opposite to the inner top wall surface 113b, a first inner side wall surface 113d, and a second inner side wall surface 113e opposite to the first inner side wall surface 113d, and the inner top wall surface 113b and the inner bottom wall surface 113c are located between the first inner side wall surface 113d and the second inner side wall surface 113e. The waterproof slot 101 extends from the first inner side wall surface 113d to the second inner side wall surface 113e through the inner top wall surface 113b, and two opposite ends of the waterproof slot 101 are connected to the drainage channel 102. The drainage channel 102 is formed on the inner bottom wall surface 113c and extends toward the opening 113a. In another aspect, the body 110 further has a drainage hole 103 located in the second receptacle slot 113, where the drainage hole 103 is located in the drainage channel 102 and is substantially located at the bottom of the body 110. Therefore, a part of the water (or other liquid) flowing through the drainage channel 102 may flow into the drainage hole 103 and may be discharged from the bottom of the body 110.

To sum up, in the electronic device provided in one or more embodiments of the disclosure, the body has the waterproof structure and the liquid dividing structure around the receptacle slot. When the user accidentally pours water (or other liquid) onto the body, the waterproof structure may block the water (or other liquid) flowing through the side wall surface of the body from entering the receptacle slot, and the drainage structure may guide the water (or other liquid) to the bottom of the body to be discharged, so as to prevent failure of or damages to the receptacle connector located in the receptacle slot or the electronic parts located in the body.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising:
   a body, having a side wall surface, a receptacle slot located at the side wall surface, a waterproof protrusion protruding from the side wall surface, and two gutters located at the side wall surface, wherein the waterproof protrusion is located above the receptacle slot, and the two gutters are located at two opposite sides of the receptacle slot, respectively; and
   a receptacle connector, disposed in the receptacle slot.

2. The electronic device according to claim 1, wherein the waterproof protrusion has a waterproof surface facing the side wall surface, a liquid dividing slot is defined between the waterproof surface and the side wall surface, and the two gutters are respectively connected to two opposite ends of the liquid dividing slot.

3. The electronic device according to claim 2, wherein the waterproof surface is connected to the side wall surface, and the waterproof surface is an inclined surface extending obliquely upward from the side wall surface.

4. The electronic device according to claim 2, wherein the liquid dividing slot is a V-shaped slot.

5. The electronic device according to claim 1, wherein the body further has a waterproof slot located in the receptacle slot, and the waterproof slot is located between the receptacle connector and an opening of the receptacle slot.

6. The electronic device according to claim 5, wherein the receptacle slot has an inner top wall surface, a first inner side wall surface, and a second inner side wall surface opposite to the first inner side wall surface, and the waterproof slot extends from the first inner side wall surface to the second inner side wall surface through the inner top wall surface.

7. The electronic device according to claim 6, wherein the receptacle slot further has an inner bottom wall surface opposite to the inner top wall surface, the inner bottom wall surface is located between the first inner side wall surface and the second inner side wall surface, and the body further has a drainage channel located at the inner bottom wall surface of the receptacle slot, wherein two opposite ends of the waterproof slot are connected to the drainage channel, and the drainage channel is connected to the opening of the receptacle slot.

8. The electronic device according to claim 7, wherein the body further has a drainage hole located in the receptacle slot, and the drainage hole is located in the drainage channel.

9. An electronic device, comprising:
   a body, having a side wall surface, a receptacle slot located at the side wall surface, a liquid dividing slot located above the receptacle slot, and two gutters respectively located at two opposite sides of the receptacle slot and respectively connected to two opposite ends of the liquid dividing slot; and
   a receptacle connector, disposed in the receptacle slot.

10. The electronic device according to claim 9, wherein the body further has a waterproof surface connected to the side wall surface, and the waterproof surface extends obliquely upward from the side wall surface, so that the waterproof surface and the side wall surface define the liquid dividing slot.

11. The electronic device according to claim 9, wherein the body further has a waterproof slot and a drainage channel, the waterproof slot and the drainage channel are located in the receptacle slot, two opposite ends of the waterproof slot are connected to the drainage channel, and the drainage channel is connected to an opening of the receptacle slot.

12. The electronic device according to claim 11, wherein the body further has a drainage hole located in the receptacle slot, and the drainage hole is located in the drainage channel.

* * * * *